United States Patent [19]
Cellier et al.

[11] Patent Number: 6,033,289
[45] Date of Patent: Mar. 7, 2000

[54] DETAILING AND CLEANING APPARATUS FOR GREEN CERAMIC DRY DICING PROCESS

[75] Inventors: Glenn L. Cellier; David S. Graboski, both of Hopewell Junction; Keith A. Markland, Poughkeepsie; Anton Nenadic, Red Hook; Mirvan Wondracek, LaGrangeville; Alan Zollner, Newburgh, all of N.Y.

[73] Assignee: International Business Machines Corporation, Armonk, N.Y.

[21] Appl. No.: 09/139,513

[22] Filed: Aug. 25, 1998

[51] Int. Cl.$^7$ ...................................................... B26D 3/08
[52] U.S. Cl. .................................. 451/28; 451/57; 83/582
[58] Field of Search ............................. 83/582, 858, 856, 83/914; 125/2, 23.01; 451/28, 57

[56] References Cited

U.S. PATENT DOCUMENTS

| | | | |
|---|---|---|---|
| 3,724,439 | 4/1973 | Cabell et al. | 125/23.01 |
| 3,757,623 | 9/1973 | Wiewel . | |
| 3,850,064 | 11/1974 | Dwyer | 83/582 X |
| 3,859,878 | 1/1975 | Bonaddio et al. | 83/582 X |
| 4,098,155 | 7/1978 | Insolio | 83/582 X |
| 4,574,817 | 3/1986 | Suzuki et al. . | |
| 5,029,504 | 7/1991 | Wilbur et al. . | |
| 5,235,880 | 8/1993 | Wilbur et al. . | |

*Primary Examiner*—David A. Scherbel
*Assistant Examiner*—Anthony Ojini
*Attorney, Agent, or Firm*—DeLio & Peterson, LLC; Peter W. Peterson; Aziz M. Ahsan

[57] ABSTRACT

An apparatus for processing a ceramic laminate comprising an array of unfired ceramic substrates having intersecting slots in at least two directions formed on a side thereof. The apparatus includes a frame and a vacuum chuck fixture movable with respect to the frame for securing the laminate. A plurality of the blade assemblies are independently movable and adapted for passage through different slots in the laminate to loosen debris therefrom. Each blade assembly comprises a pair of blade portions having opposed and spaced tapered cutting edges biased against the wall of the slot by a spring. The pair of blade portions is adapted for lateral movement during passage along the slot toward and away from the slot wall, wherein one of the blade portion pairs guides the other of the blade portion pairs for contact with the slot wall. A flexible cleaner includes fabric pads, an oscillating brush and a vacuum cleaner and passes along the slot after passage of the blade assembly to remove loosened debris from the slot.

31 Claims, 6 Drawing Sheets

DETAILING AND CLEANING APPARATUS FOR GREEN CERAMIC DRY DICING PROCESS

BACKGROUND OF THE INVENTION

1. Field of the Invention

The present invention is directed to an apparatus and method for processing of unfired ceramic laminated sheets and, in particular, to an apparatus and method for detailing and cleaning green ceramic laminated sheets after a dry dicing process for use in electronic applications.

2. Description of Related Art

To form ceramic substrates for use in electronic applications, for example as substrates for microprocessors and other microelectronic components, unfired ceramic such as alumina in the green state is formed as a multilayer ceramic laminate and then dry diced into the individual substrates. Dry dicing is typically performed using blades which make a first series of cuts in one direction, and then a second series of cuts in a direction 900° to the first direction. The substrate sections are usually made in either a square or rectangular configuration.

Typically nickel/diamond electro formed blades are used for the dry dicing process. During processing, the green ceramic can build up on the side of the dicing blade, causing the blade to cut a wider kerf than the blade width. This side coating which builds up on the dicing blade has been found to remain somewhat constant and predictable after a number of dressing cuts. However, it has also been found that this side coating wipes off during the 90° cross cuts. This debris tends to build up on the corners of the substrates and is referred to as "tails." It has also been found that the heat generated by the dicing process tends to bind these tails to the corner of the substrates.

Such tails can cause problems in subsequent processing because of the sharp burr and added X-Y dimension on the substrates after sintering. They can also fall off and contaminate the substrate during sintering and subsequent processing.

Bearing in mind the problems and deficiencies of the prior art, it is therefore an object of the present invention to provide an apparatus and method for processing ceramic substrates to remove debris from the slots between the substrate.

It is another object of the present invention to provide an apparatus and method for removing the debris, burrs and tails built up along the corners of unfired ceramic substrates prior to sintering.

A further object of the invention is to provide an apparatus and method for removing such debris from unfired ceramic substrates which may be integrated into existing processing.

It is yet another object of the present invention to provide such an apparatus and method which is cost effective.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an apparatus for processing a ceramic laminate comprising an array of unfired ceramic substrates having intersecting slots in at least two directions formed on a side thereof. The apparatus includes a frame and a fixture movable with respect to the frame for securing the laminate, wherein the fixture is adapted to expose the slots for processing. A blade assembly is secured to the frame. The blade assembly has a cutting edge for passing along a slot extending in one direction on the laminate. The cutting edge is adapted to contact a wall of the slot to loosen debris therefrom.

Preferably, the apparatus includes a plurality of the blade assemblies, with each blade assembly being independently movable and adapted for passage through different slots in the laminate to loosen debris therefrom. More preferably, the blade assembly comprises a pair of blade portions each having a cutting edge thereon, wherein the cutting edges are opposed and spaced apart by a distance equal no less than a width of the slot and adapted for contact with the wall of the slot. Each of the blade portions of the blade assembly may be biased against the wall of the slot by a spring. The pair of blade portions is adapted for lateral movement during passage along the slot toward and away from the slot wall, wherein one of the blade portion pairs guides the other of the blade portion pairs for contact with the slot wall. There may also be provided a pair of the blade assemblies biased in opposing directions against opposing walls of the slot. The cutting edge on at least one of the cutting edges may be tapered in a direction to move loosened debris away from the wall of the slot during passage along the slot.

Also, there may be included a flexible cleaner on the frame, spaced from the blade assembly, for passing along the slot after passage of the blade assembly to remove loosened debris from the slot. Preferably, the flexible cleaner includes a plurality of fabric pads and a brush adapted to oscillate orbitally with respect to a laminate on the fixture. The apparatus may further include a vacuum cleaner for vacuuming removed debris from the laminate.

The fixture preferably includes a vacuum chuck for securing the laminate and pins for registering with openings in the laminate on a side opposite the slots. At least one air jet may be included in the fixture for assisting removal of the substrates after processing. A tray is also provided for depositing substrates from the fixture after processing.

In another aspect, the present invention provides a method of cleaning a ceramic laminate comprising an array of unfired ceramic substrates having intersecting slots in at least two directions formed on a side thereof to remove debris. The method includes contacting a wall of a first slot extending in one direction on the laminate with a cutting edge of a first blade to loosen debris therefrom. Thereafter the wall of the first slot is contacted with a flexible cleaner to remove loosened debris from the first slot. Preferably, a second blade is used in conjunction with the first blade to guide lateral movement of the first blade against the wall of the slot.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
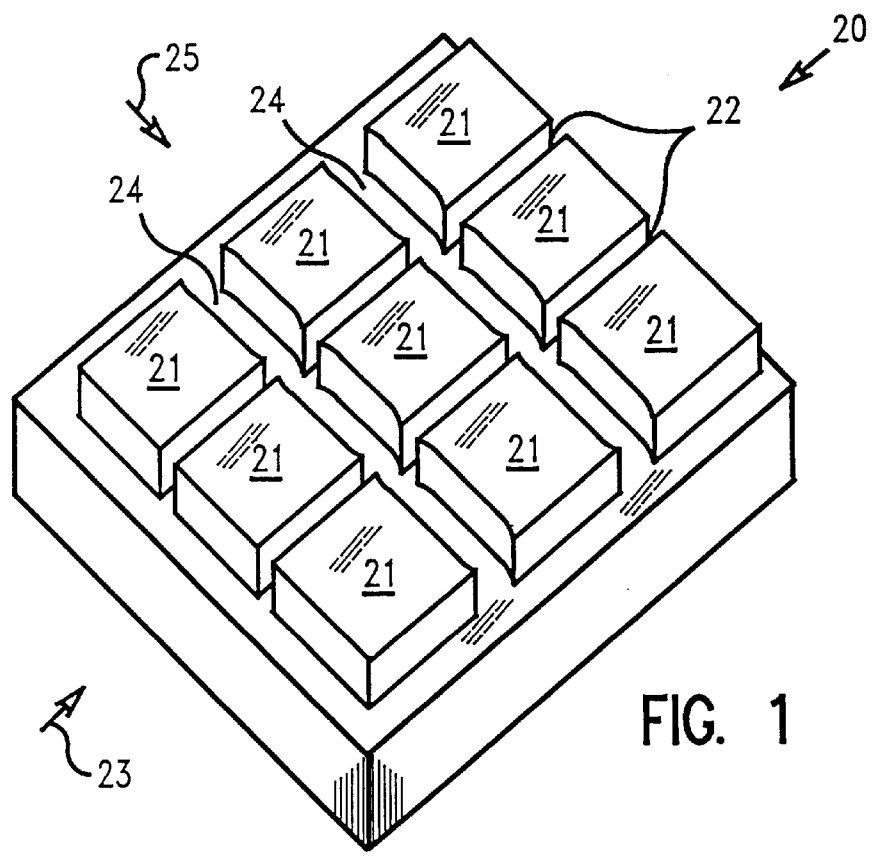
FIG. 1 is a perspective view of an array of diced unfired ceramic substrates immediately after dry dicing.

In describing the preferred embodiment of the present invention, reference will be made herein to FIGS. 1 through 11 of the drawings in which like numerals refer to like features of the invention. Features of the invention are not necessarily shown to scale in the drawings.

The present invention is directed to an apparatus and method designed to remove and clean debris such as the aforementioned burrs and tails created in the cross cuts of dry diced ceramic substrates while still in the green or unfired state. The apparatus may be utilized immediately following dry dicing and the substrates may be transferred to the apparatus of the present invention while in the diced registration and configuration.

Figure 2:
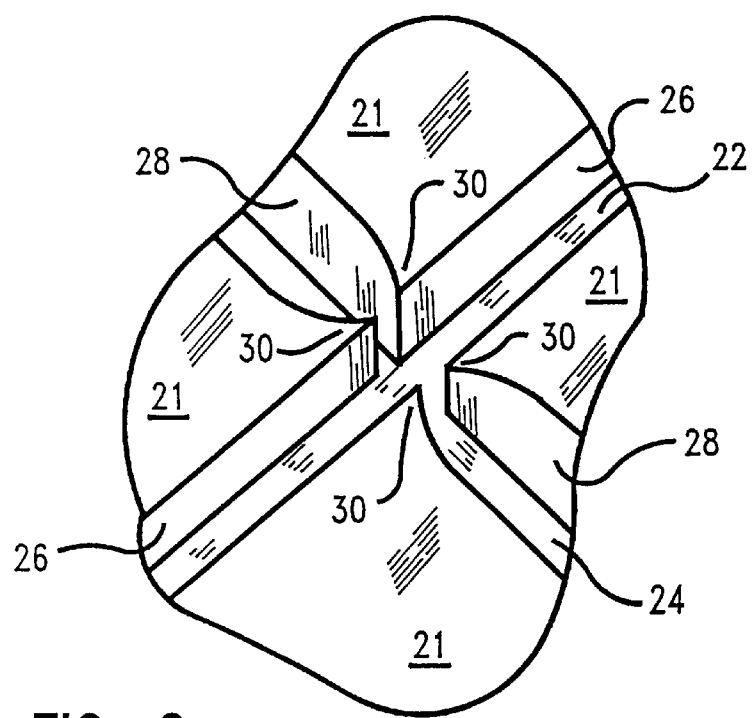
FIG. 2 is a perspective view of a portion of the corners at a pair of intersecting slots of the ceramic substrates of FIG. 1, showing the formation of debris, burrs and tails.

FIGS. 1 and 2 show a multilayer ceramic laminate diced into an array of substrates 21 with each substrate 21 being separated from another in the array by intersecting slots or channels which were cut by the dicing blades. Open slots 22 are formed in the 0° direction indicated by arrow 23 and open slots 24 are arrayed in the 90° direction shown indicated by arrow 25.

The detail of the intersecting slots separating the ceramic substrates as shown in FIG. 2. Slot 22 has walls 26 formed by the ceramic substrate edges and slot 24 has walls 28 also formed by the ceramic substrate edges. At the corners of the ceramic substrates, where the slots intersect, there is shown tail segments 30 where the excess material from the dicing knife is deposited at the corner. This material is adhered around the corner so that a true right angle is not formed and, instead, there is a portion of the green ceramic material extending out into the previously formed intersecting slot.

The preferred apparatus for processing the unfired ceramic laminate to clean and detail the slots between the green ceramic substrates is shown in FIGS. 3 through 11.

Figure 3:
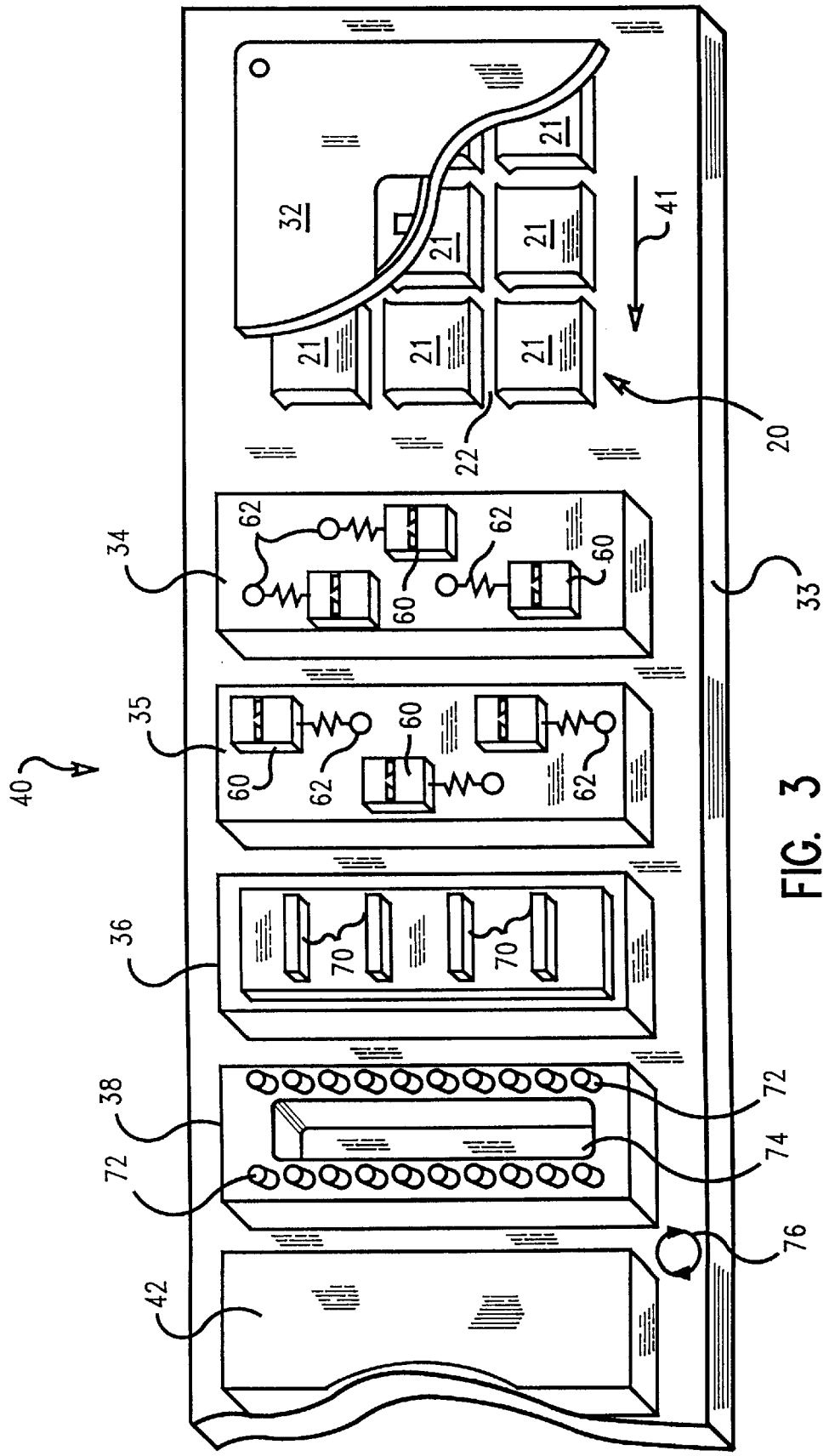
FIG. 3 is a perspective view of the preferred apparatus of the present invention.

In FIG. 3, a frame 33 carries a movable pickup paddle or fixture 32 beneath which is mounted the array of diced unfired green ceramic substrates. Fixture 32 carries the ceramic substrates to subsequent processing stations in the direction shown by arrow 41.

A pair of blade assemblies 34, 35 is mounted in the next position on frame 33. Both of the blade assemblies carry independently movable blade assembly bases 60, each of which is biased by a spring 62. Each blade assembly carries in its preferred embodiment a pair of opposed, spaced blades for removing the tails from the corners and slots of ceramic laminate 20. Blade assembly 34 has its individual blade bases biased in one direction to treat one of the walls of each of the ceramic substrate slots, while blade assembly 35 has its individual blade bases biased in the opposite direction so that the blades contact and treat the opposing wall of the same set of slots on the ceramic substrate.

Next on apparatus frame 33 are mounted debris removal stations 36, 38. Station 36 has mounted on it a plurality of flexible pads 70, each pad aligned with a slot of ceramic laminate 20. Each fabric pad 70 passes through a slot to remove debris which was previously loosened by the blades in assemblies 34–35. Next, there is provided an oscillating brush and cleaning station 38. The brush and cleaning station 38 contains thereon two rows of brushes 72 having fibers which can extend over the surfaces of the ceramic substrates 21 as well as into the slots 22 formed by the dicing process between the substrates. The brushes extend normal to the direction of movement of the fixture and substrate 41. A vacuum port 74 is provided between the two rows of brushes 72 to vacuum and remove debris from the tails and otherwise loosened by the previous blade assemblies and flexible pad cleaning station. The brush and vacuum assembly 38 may also oscillate in an orbital fashion in direction 76, in the plane of the ceramic substrates, in order to provide more effective cleaning. Following the aforementioned processing, the ceramic substrates array 21 may be dropped from the fixture into tray 42 for subsequent processing.

Figure 4:
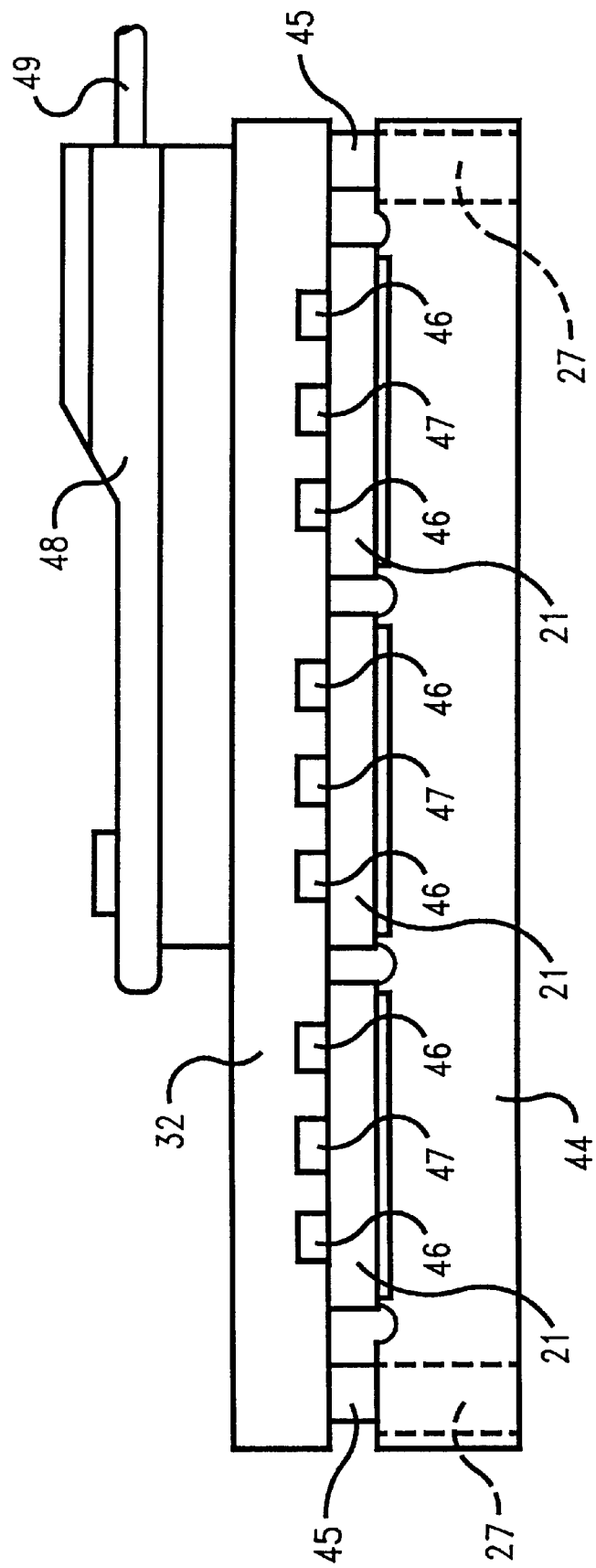
FIG. 4 is a side elevational view, partially in cross-section of the preferred fixture or paddle for securing the array of diced green ceramic substrates during processing in accordance with the present invention.
Figure 5:
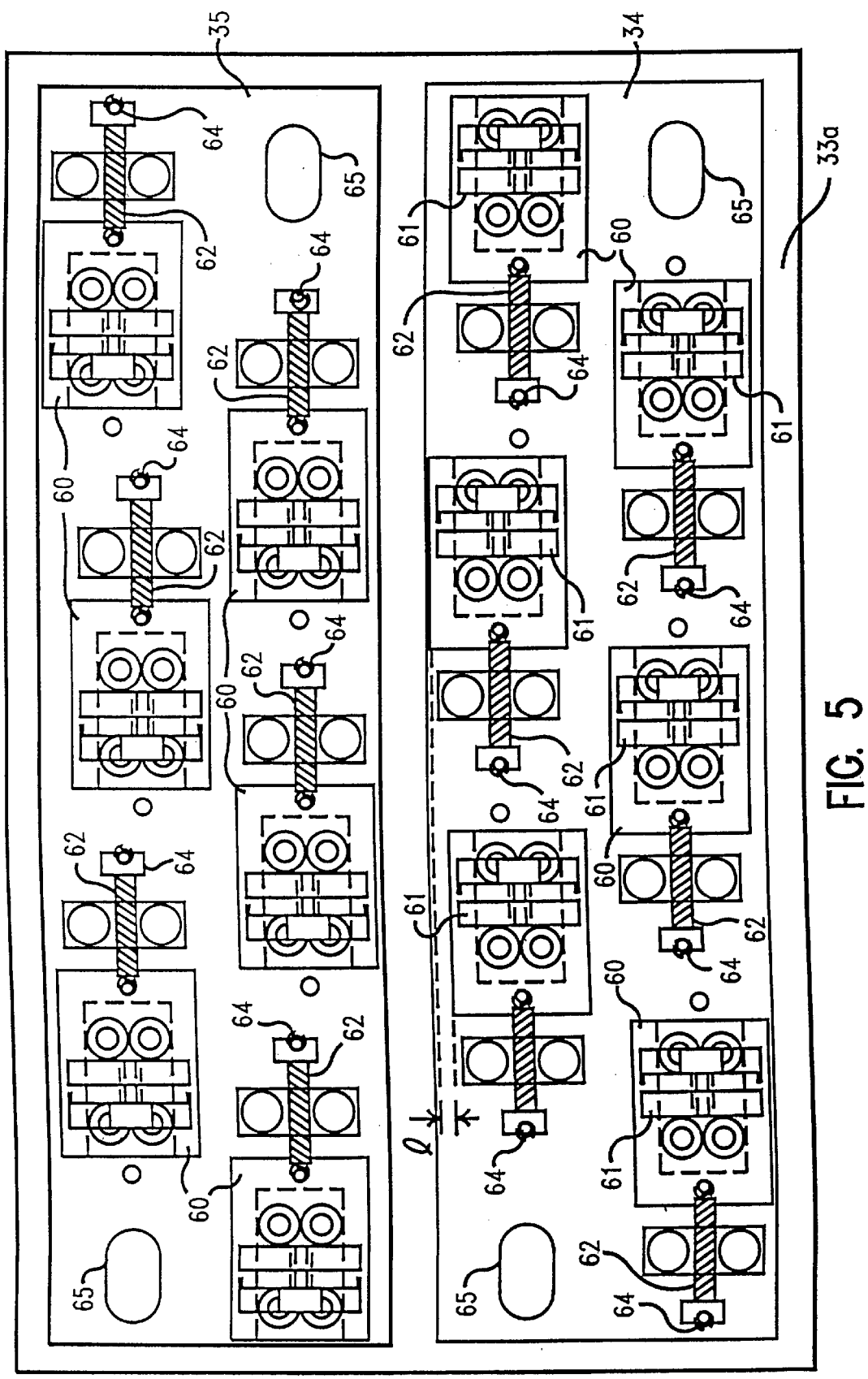
FIG. 5 is a top plan view of the preferred array of spring loaded blade assemblies used to cut and loosen the tails in the dry diced ceramic substrates.

The paddle or fixture assembly 32 is shown in more detail in FIG. 4. Fixture 32 includes a handle 48 on the top surface and, on the opposing bottom surface, a plurality of extending pins 45. The underside of the paddle fixture 32 contains vacuum openings 46 which are connected to a source of vacuum (not shown) through vacuum line 49. The pins 45 are registered with complimentary openings 27 in vacuum chuck 44, which is a part of the dry dicing system. Thus, the substrates 21 mounted on dry dicing system vacuum chuck 44 may be transferred to paddle fixture 32 and held there by vacuum in the same orientation and arrangement resulting from the dry dicing process. Paddle fixture 32 also contains air jets 47 which are used to remove the substrates after processing in accordance with the present invention, as will be discussed further below.

Figure 6:
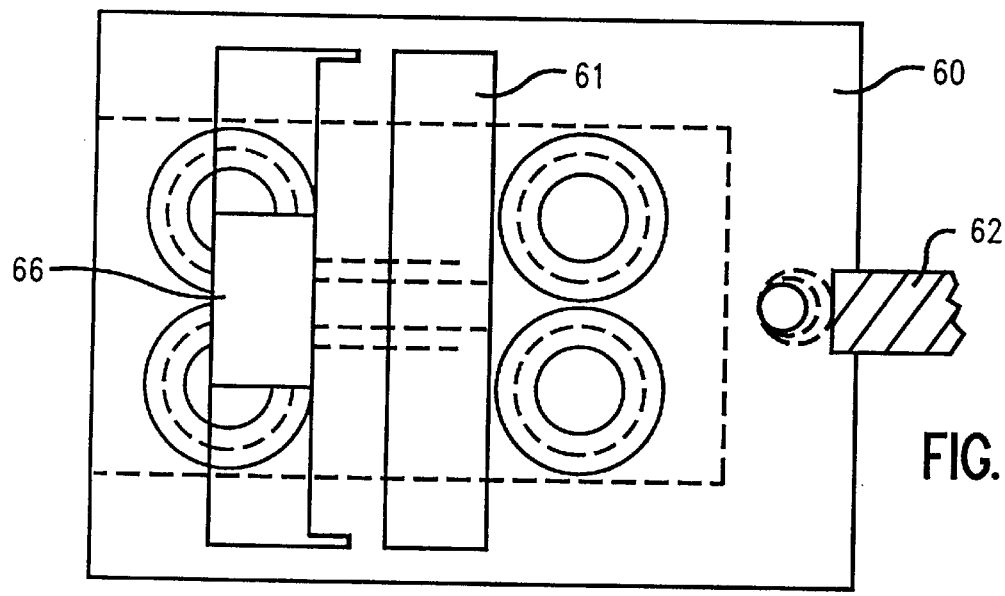
FIG. 6 is a top plan view of one of the blade assemblies of FIG. 6.
Figure 7:
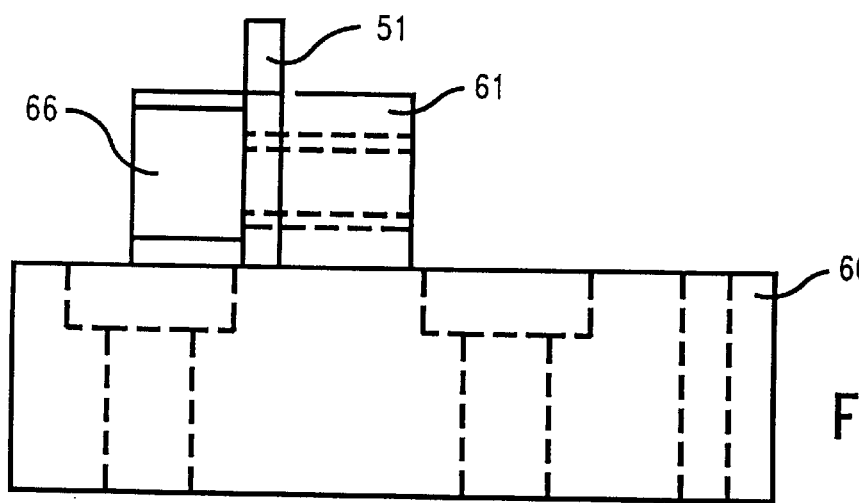
FIG. 7 is a side elevational view, partially in cross-section, the blade of assembly of FIG. 6.

As shown in FIGS. 5 through 8, the blade assemblies 34–35 contain individually movable blade assembly bases 60 upon which are mounted a pair of opposing blades 50, 51. The individual blade assembly bases 60 are spring biased by springs 62 connected in tension to pins 64 on the blade assembly and pins 63 on the individual bases 60. The individual bases 60 are staggered or offset in each row with respect to each other in the direction of travel of the apparatus. The offset distance is shown by the letter 1 in FIG. 5 between two of the individual bases. The offset distance may be determined according to the requirements of the apparatus to distribute the onset of the cutting load and may be, for example, 0.040 in. As shown in FIG. 6, the blades on base assembly 34 are biased toward the left while the blades on blade assembly 35 are biased toward the right.

Figure 8:
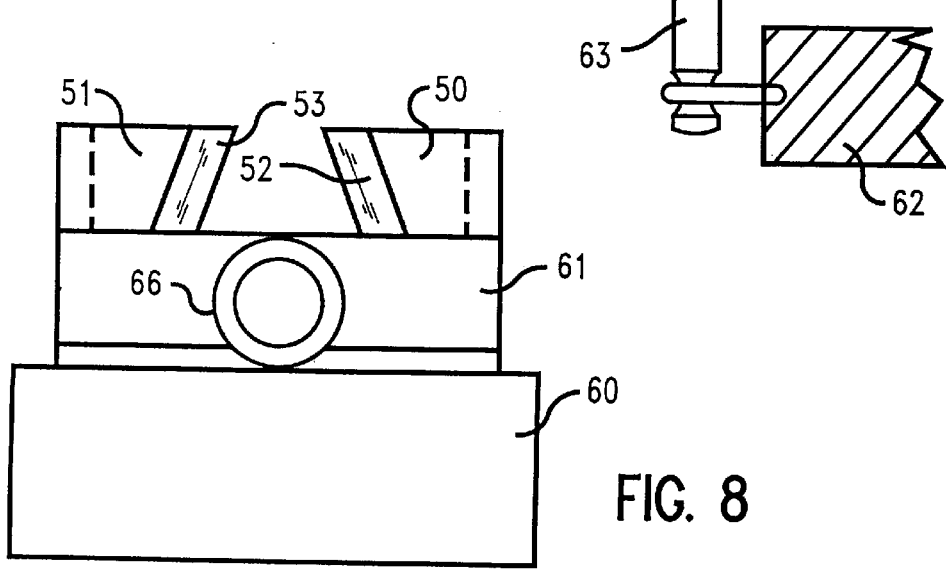
FIG. 8 is an end elevational view of the blade assembly of FIG. 6.
Figure 9:
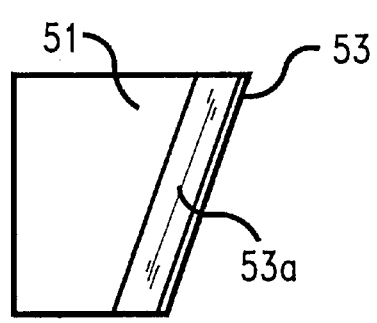
FIG. 9 is a side elevational view of one of the blades utilized in the blade assembly of FIG. 6.
Figure 10:
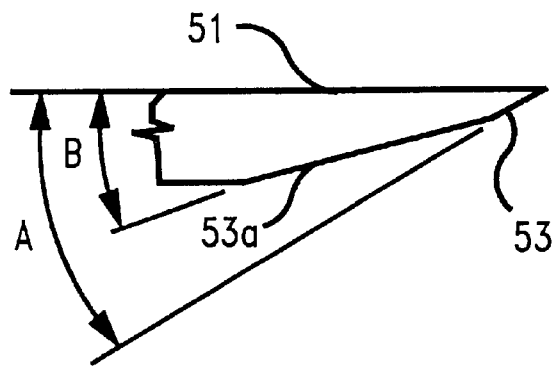
FIG. 10 is a top plan view of the blade of FIG. 9.

The individual blades 50, 51 are secured between pedestal 61 portions by bolt 66 so that the cutting edges 52, 53, respectively, face each other. The cutting edges of opposing blades 50, 51 both taper toward each other from the lower portion to the upper portion, as seen in FIG. 8. As shown in more detail in FIGS. 9 and 10, the cutting edge 53 of blade 51 has a cutting portion at angle A and a relief portion 53a at angle B (FIG. 10). Blade 50 is a mirror image of blade 51 as shown.

Figure 11:
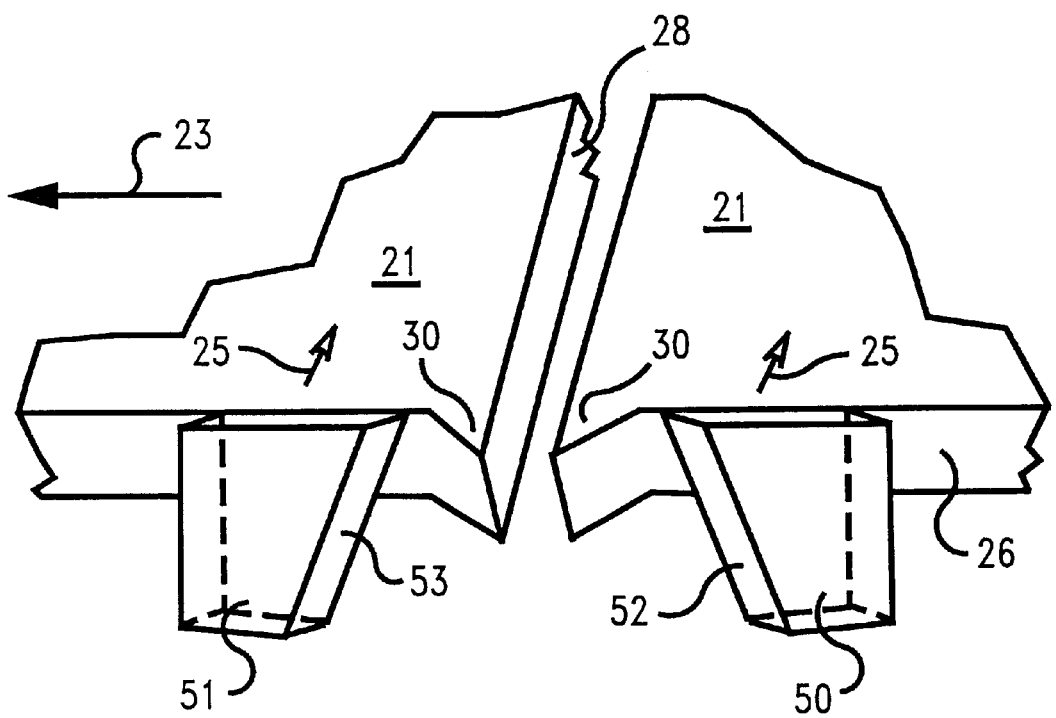
FIG. 11 is an enlarged perspective view of the preferred blades utilized to trim and loosen the tails from the ceramic substrate corners.

The operation of the blades to cut the green ceramic tail is shown in more detail in FIG. 11. While traveling in direction 23 along the 0° direction slot, each of the blades 50, 51 is in contact with one wall 26 of the slot as a result of being biased in direction 25. As the substrates move in direction 23 with respect to the fixed blades 50, 51, the first blade 50 acts as a guide which rides over tail portions 30 which extend out from the edge of substrates 21. After the guiding or lead-in blade bit 50 passes the tails, it is snapped back against straight wall segment 26 by the action of spring 62 and to bring the cutting edge 53 of blade 51 into position to subsequently cut off tails 30. This action continues through the full length of the slot of the diced laminates. The plurality of blade pairs on blade assemblies 34, 35 provide a staggered cut to each wall of each slot of the ceramic laminate 20.

Following the removal of the tails by the blades, the substrates 21 then subsequently pass over the fabric pads which extend into the slots to remove the debris from the cut tails, and then to the oscillating brush and vacuum cleaner 38 which removes any remaining debris.

After processing, the paddle fixture 32 moves the substrates over tray 42, at which time the vacuum is discontinued and the air jets are engaged to drop the substrates 21 into the tray for further processing.

As a result of the present invention, there is provided a cost effective apparatus and method for removing the tail debris which results from the dry dicing process. Such debris removal permits more efficient processing of the ceramic substrates for use in microelectronic devices by removing any loose debris which could interfere with such processing.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for processing a ceramic laminate comprising an array of unfired ceramic substrates having intersecting slots in at least two directions formed on a side thereof comprising:
   a frame;
   a fixture movable with respect to said frame for securing said laminate, said fixture adapted to expose said slots for processing;
   a blade assembly on said frame having a cutting edge thereon secured to said frame for passing along a slot extending in one direction on said laminate, said cutting edge adapted to contact a wall of said slot to loosen debris therefrom; and
   a flexible cleaner on said frame spaced from said blade assembly for passing along said slot after passage of said blade assembly to remove loosened debris from said slot.

2. The apparatus of claim 1 including more than one blade assembly, each blade assembly being independently movable and adapted for passage through different slots in said laminate to loosen debris therefrom.

3. The apparatus of claim 1 wherein said blade assembly comprises a pair of blade portions each having a cutting edge thereon, said cutting edges being opposed and spaced apart and adapted for contact with said wall of said slot.

4. The apparatus of claim 3 wherein each of said blade portions of said blade assembly is biased against said wall of said slot.

5. The apparatus of claim 4 wherein said blade assembly further includes a spring for biasing each of said blade portions against said wall of said slot.

6. The apparatus of claim 3 including a pair of said blade assemblies, said blade assemblies being biased in opposing directions against opposing walls of said slot.

7. The apparatus of claim 3 wherein the cutting edges of said blade portions is spaced by a distance equal no less than a width of said slot.

8. The apparatus of claim 3 wherein said cutting edges are tapered.

9. The apparatus of claim 8 wherein said cutting edge on at least one of said cutting edges is tapered in a direction to move loosened debris away from said wall of said slot during passage along said slot.

10. The apparatus of claim 1 wherein said flexible cleaner includes a plurality of fabric pads.

11. The apparatus of claim 1 wherein said flexible cleaner includes a brush.

12. The apparatus of claim 11 wherein said brush is adapted to oscillate orbitally with respect to a laminate on said fixture.

13. The apparatus of claim 11 further including a vacuum cleaner for vacuuming removed debris from said laminate.

14. The apparatus of claim 1 wherein said fixture includes a vacuum chuck for securing said laminate.

15. The apparatus of claim 1 wherein said fixture includes pins for registering with openings in said laminate on a side opposite said slots.

16. The apparatus of claim 1 wherein said fixture includes at least one air jet for assisting removal of said substrates after processing.

17. The apparatus of claim 3 wherein said pair of blade portions are adapted for lateral movement during passage along said slot toward and away from the slot wall.

18. The apparatus of claim 17 wherein one of said blade portion pairs is adapted to guide the other of said blade portion pairs for contact with the slot wall.

19. The apparatus of claim 1 further including a tray for depositing substrates from said fixture after processing.

20. An apparatus for processing a ceramic laminate comprising an array of unfired ceramic substrates having intersecting slots in at least two directions formed on a side thereof to remove debris comprising:
   a frame;
   a fixture movable with respect to said frame for securing said laminate, said fixture adapted to expose said slots for processing;
   a blade assembly on said frame having a pair of blade portions each having a cutting edge thereon, said cutting edges being opposed and spaced apart and adapted for passing along a slot extending in one direction on said laminate and contact a wall of said slot to loosen debris therefrom.

21. The apparatus of claim 20 including more than one blade assembly each blade assembly being independently movable and adapted for passage through different slots in said laminate to loosen debris therefrom.

22. The apparatus of claim 20 wherein each of said blade portions of said blade assembly is biased against said wall of said slot.

23. The apparatus of claim 22 wherein said blade assembly further includes a spring for biasing each of said blade portions against said wall of said slot.

24. The apparatus of claim 20 including a pair of said blade assemblies, said blade assemblies being biased in opposing directions against opposing walls of said slot.

25. The apparatus of claim 20 wherein the cutting edges of said blade portions are spaced by distance equal no less than a width of said slot.

26. The apparatus of claim 20 wherein said cutting edges are tapered.

27. The apparatus of claim 26 wherein said cutting edge on at least one of said cutting edges is tapered in a direction to move loosened debris away from said wall of said slot during passage along said slot.

28. The apparatus of claim 20 wherein said pair of blade portions are adapted for lateral movement during passage along said slot toward and away from the slot wall.

29. The apparatus of claim 28 wherein one of said blade portion pairs is adapted to guide the other of said blade portion pairs for contact with the slot wall.

30. A method of cleaning a ceramic laminate comprising an array of unfired ceramic substrates having intersecting slots in at least two directions formed on a side thereof to remove debris comprising the steps of:

a) contacting a wall of a first slot extending in one direction on said laminate with a cutting edge of a first blade to loosen debris therefrom; and b) thereafter contacting said wall of said first slot with a flexible cleaner to remove loosened debris from said first slot.

31. The method of claim 30 further including in step (a) contacting said wall with a second blade, said second blade guiding lateral movement of said first blade against said wall of said slot.

\* \* \* \* \*